United States Patent

Sunaga et al.

[11] Patent Number: 5,732,042
[45] Date of Patent: Mar. 24, 1998

[54] DRAM ARRAY WITH LOCAL LATCHES

[75] Inventors: Toshio Sunaga, Kusatsu; Koji Hosokawa, Ohtsu, both of Japan

[73] Assignee: International Business Machines, Armonk, N.Y.

[21] Appl. No.: 743,953

[22] Filed: Oct. 29, 1996

[30] Foreign Application Priority Data

Oct. 31, 1995 [JP] Japan .................................. 7-283849

[51] Int. Cl.$^6$ ............................................ G11C 8/00
[52] U.S. Cl. .............................. 365/230.06; 365/63
[58] Field of Search ........................ 365/230.06, 63, 365/203, 230.08, 189.05, 230.04, 190

[56] References Cited

U.S. PATENT DOCUMENTS

| | | | |
|---|---|---|---|
| 5,132,928 | 7/1992 | Hayashikoshi | 365/63 |
| 5,208,778 | 5/1993 | Kumanoya | 365/63 |
| 5,317,539 | 5/1994 | Hoshino | 365/207 |
| 5,539,700 | 7/1996 | Kawahara | 365/190 |
| 5,586,078 | 12/1996 | Takase | 365/189.05 |

*Primary Examiner*—A. Zarabian
*Attorney, Agent, or Firm*—Robert A. Walsh

[57] ABSTRACT

A DRAM array has a row decoder means 2 and a column decoder 3 which are connected to a word line and a bit line of a cell matrix portion, respectively. The column decoder means 3 comprises a plurality of bit switches 44 and 46 for connecting a predetermined bit line to an output bus. Local latches 36 store data bits, each of the local latches provide for one group of bit lines 32 which is a unit of predetermined number of bit lines. The bit switches are arranged in a hierarchical structure, and connection between the bit line and the output bus is attained by two bit switches connected in series thereby load capacitance on the data lines 52 and 56 being able to be reduced. Data in respective local latches 36 is stored in the local buffer 74 in a predetermined order so that it can be burst transferred at a high speed.

14 Claims, 4 Drawing Sheets

DRAM ARRAY WITH LOCAL LATCHES

BACKGROUND OF THE INVENTION

1. Field of the Invention

The present invention relates to technology for improving data access speed in a dynamic random access memory (DRAM).

2. Discussion of the Related Art

A DRAM cell consists of one switching transistor and one capacitance. Because of such simple construction, it consumes less area on the chip, and is used in various fields.

An array comprising a plurality of DRAM cells is called a DRAM array in the following. A disadvantage of the DRAM array lies in that it does not have a fast access speed. Particularly, when it is used for a main memory, there arises a serious problem from miss-match between increase of the operation speed of a microprocessor and the relatively low access speed of the DRAM array (speed difference between them). Various approaches have been proposed to eliminate such miss-match.

These approaches can be roughly divided into the following two categories.

(1) The DRAM array consists of a matrix of memory cells. An entire specific row is first accessed (RAS access). The RAS access time conventionally requires a relatively long period of time of several cycles. It is intended to shorten the RAS access time.

(2) It is arranged to continuously output data as in the page mode so that the data output speed is improved.

Examples of the former include a so-called high speed DRAM (HSDRAM). It can improve the RAS access time to less than 20 ns. However, in attaining it, it is inevitable to lose compatibility with the conventional DRAM architecture, or to increase the die size. In addition, the HSDRAM has a disadvantage of high cost because it employs the BiCMOS technology.

On the other hand, examples of the latter include a synchronous DRAM. If it is to obtain the maximum data transfer rate at the minimum increase of cost by utilizing in data burst a clock is used the same as that for controlling a microprocessor. A RAMBUS DRAM (RDRAM) more positively employs such an approach, enabling it to attain data transfer at 500 MHz by utilizing both the rising and falling edges of 50 MHz clock. However, this approach consumes much power, and requires a larger die size so that circuit design becomes complicated.

Thus, it is the technical trend in the past that examples for improvement through the former never pay attention to the latter, while examples for improvement through the latter never pay attention to the former. That is, there is few attempts to simultaneously attain both (1) increase of RAS access speed, and (2) increase of data transfer rate. This is because these approaches have been separately developed in a manner such that each approach pursues its purpose in an incompatible design with the other.

As described earlier, it is a significant appealing point that DRAM is inexpensive because it consumes less area. Improvement of the product will be impractical even if high access speed is attained without maintaining such advantage of low area consumption. SDRAM has maintained it by introducing the pipelined architecture or two-bit prefetch. However, the pipelined architecture consumes very much power because all circuit blocks from a column address decoder to an I/O buffer are turned on in response to the operation of clock. The two-bit prefetch architecture suffers less from such problem, but can receive interrupt only every other clocks while burst transfer is being performed. This reduces flexibility in use, leading to delay of the operation.

FIG. 1 shows a memory cell array, sense amplifiers or the like in a prior art DRAM. The memory cell array 1 is typically in a 256×256 cell matrix to which a row address decoder 2 for decoding a row address and a column address decoder 9 for decoding a column address are connected through a sense amplifier 3. When a specific row address is decoded by the row address decoder 2, all bit signals contained in the specified row are amplified and latched by the sense amplifier. The column address decoder 9 is connected to 256 bit select lines 10. When the bit select line 10 is turned on, a bit line 6 is connected to a data line 7 through a switch 5. Then, data relating to a specific column address decoded by the column address decoder 9 out of the data relating to the specific row held in the sense amplifier 3 is transferred to an I/O sense amplifier 8 and amplified thereby. Such amplification in two stage is required because the sense amplifier 3 provides insufficient driving force.

Meanwhile, since the data line 7 is connected to 256 MOSFETs each of which acts as a switch, it normally has a large load capacitance of about 1.8 pF. Accordingly, there arises such phenomenon that potential is inverted by the large load on the data line 7 at the moment when the bit switch 5 is turned on. Since it is the small transistor of the sense amplifier 3 to drive the load, it is necessary to turn on the bit switch 5 after the bit line 6 is completely swung to Vdd or Gnd in order to prevent malfunction due to such inversion.

FIG. 2 shows where the bit line 6 starts its swing at the moment 16 of about 10 ns, and then swings to Vdd or Gnd over about 15 ns. When the bit switch is turned on at the moment 19 of 42 ns after the amplification at the moment 18 of about 27 ns, the inversion of bit line 20 occurs as observed at 40-45 ns. This inversion is caused by the large load capacitance from 256 MOSFETs connected to the data line 7 as described above. Since, in FIG. 2, the bit switch is turned on after the bit line sufficiently swings to Grid, there is no error in data reading. However, such significant inversion phenomenon 20 has a sufficient possibility for causing error in data. Such error is caused if 0 data is erroneously recognized as 1 when the data I/O line is read at the moment the potential exceeds the precharge voltage because of the inversion. Therefore, the bit switch 5 can be turned on only after the sense amplifier 3 completely latches the potential on the bit line, and the bit line 6 fully swings to Vdd or Gnd. This means that the RAS access takes much time.

Another problem is a time lag between the moment 16 when the bit line 6 starts the swing and the moment 18 when the sense amplifier 3 starts latching. The duration between these moments needs to be about 15 ns at present. This duration causes non-negligible impact on delay of RAS access. However, amplification by the sense amplifier 3 cannot be started before the bit line 6 sufficiently swings. This is because the sense amplifier has some offset due to variation in components such as the transistors or the bit lines, and may cause erroneous operation before a potential difference further larger than the voltage by the offset is generated across the bit line. Normal operation requires the bit line to cause variation of about 150 mV from the precharge voltage.

SUMMARY OF THE INVENTION

There is limitation in increasing the speed of DRAM if it is separately planned to shorten the RAS access time, and to increase the data transfer rate. The present invention is intended to combine and implement both approaches in one design so that DRAM is further increased for its speed.

To shorten the RAS access, it is necessary to turn the bit switch on at a timing as early as possible as described above. A factor preventing it was inversion of the data line due to the large capacitance applied to the data line at the moment when the bit switch is turned on. Accordingly, it is necessary to reduce the number of MOSFETs connected to the data line so as to minimize the inversion of data line.

Another factor affecting delay of RAS access is the duration from the time when the bit line starts swing to the time when sense amplification can be started. Since the amplification by the sense amplifier cannot be started unless the voltage difference of bit lines exceeds a predetermined value, it should be studied to employ a precharge scheme causing the bit line to swing over a predetermined voltage difference in a short period of time.

In addition, it is necessary to establish a scheme which burst transfers at a high speed the data bit obtained by the fast RAS access through solution of these problems. The scheme for burst transfer should be compatible with the scheme for obtaining the fast RAS access.

These problems of the present invention can be solved by a DRAM array having cell matrix portion having DRAM cells each connected at an intersection of one of a plurality of word lines and one of a plurality of bit lines; a word line detector means connected to the plurality of word lines; a plurality of sense amplifiers each of which is connected to one of the plurality of bit lines; a bit line decoder means connected to the plurality of sense amplifiers, the bit line decoder means comprising a plurality of bit switches which connects predetermined bit lines relating to supplied column address to the output bus, and local latches provided for each group of bit lines (two or more existing for one matrix) which is the unit of the predetermined bit lines, and which stores data bits. Particularly, the bit switches are in a hierarchical structure, so that the bit line is connected to the output bus through two or more bit switches connected serially, which is a feature of the present invention. Since the load capacitance of data line is significantly reduced from the prior art with such bit switch arrangement, the inversion can be prevented when the data line and the bit line are connected by the bit switch.

In addition, data stored in the respective local latches relating to each group of bit lines is serially transferred to and stored in the local buffer in a predetermined order. After the data is serially stored in the local buffer in the predetermined order, it is assured to be burst transferred from the local buffer at a high speed.

Furthermore, it is a feature of the operation of DRAM array according to the present invention that the difference of potential based on the data appearing on the bit line is amplified by the sense amplifier while previously holding the data lines and the bit lines at either the maximum or minimum potential. For example, when the bit switch is composed of NMOSs, the data and bit lines are previously precharged to Vdd, the maximum potential. Then, since the bit switch does not conduct while the potential on the bit line is above a predetermined value even if the potential difference based on the stored data appears on the bit-line pair and the gate of bit switch is held at Vdd, fine tuning becomes unnecessary for the timing between the operation of the sense amplifier and opening of the bit switch. Thus, more fast RAS access becomes possible together with the above-mentioned prevention of inversion.

DETAILED DESCRIPTION OF A PREFERRED EMBODIMENT OF THE INVENTION

Figure 1:
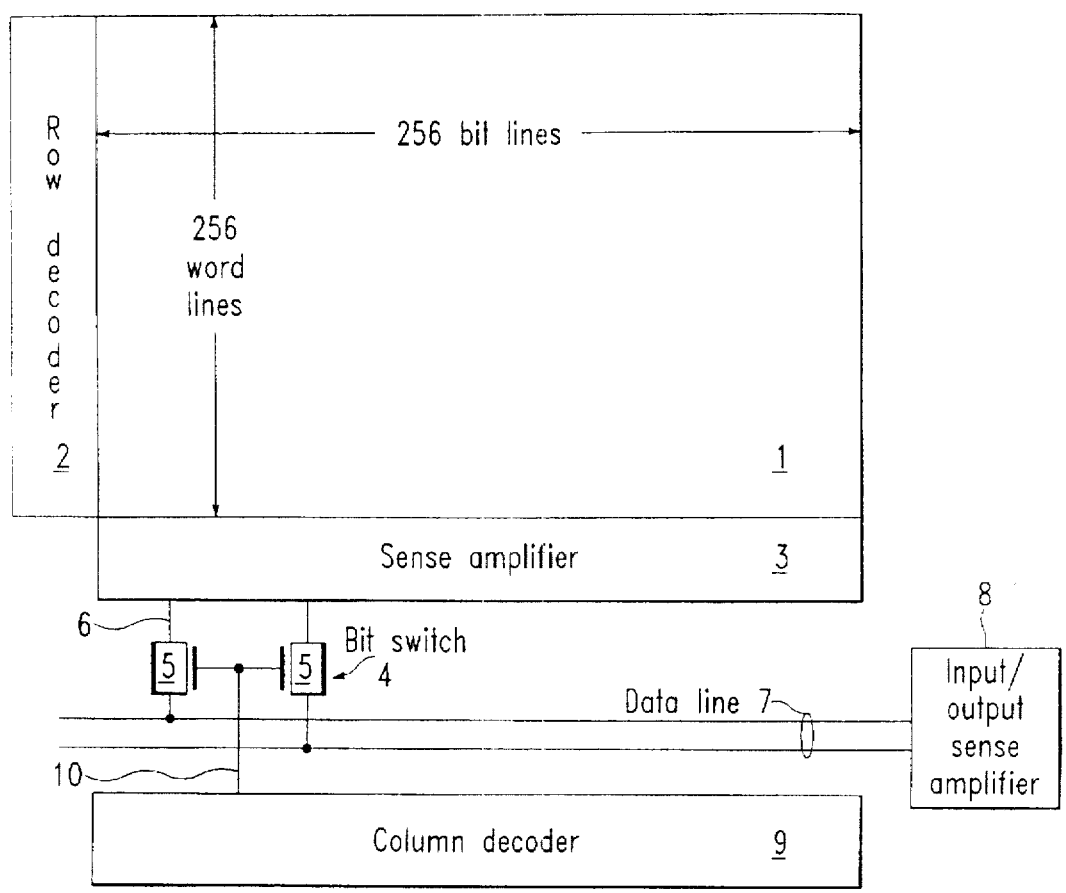
FIG. 1 is a DRAM array according to the prior art.
Figure 3:
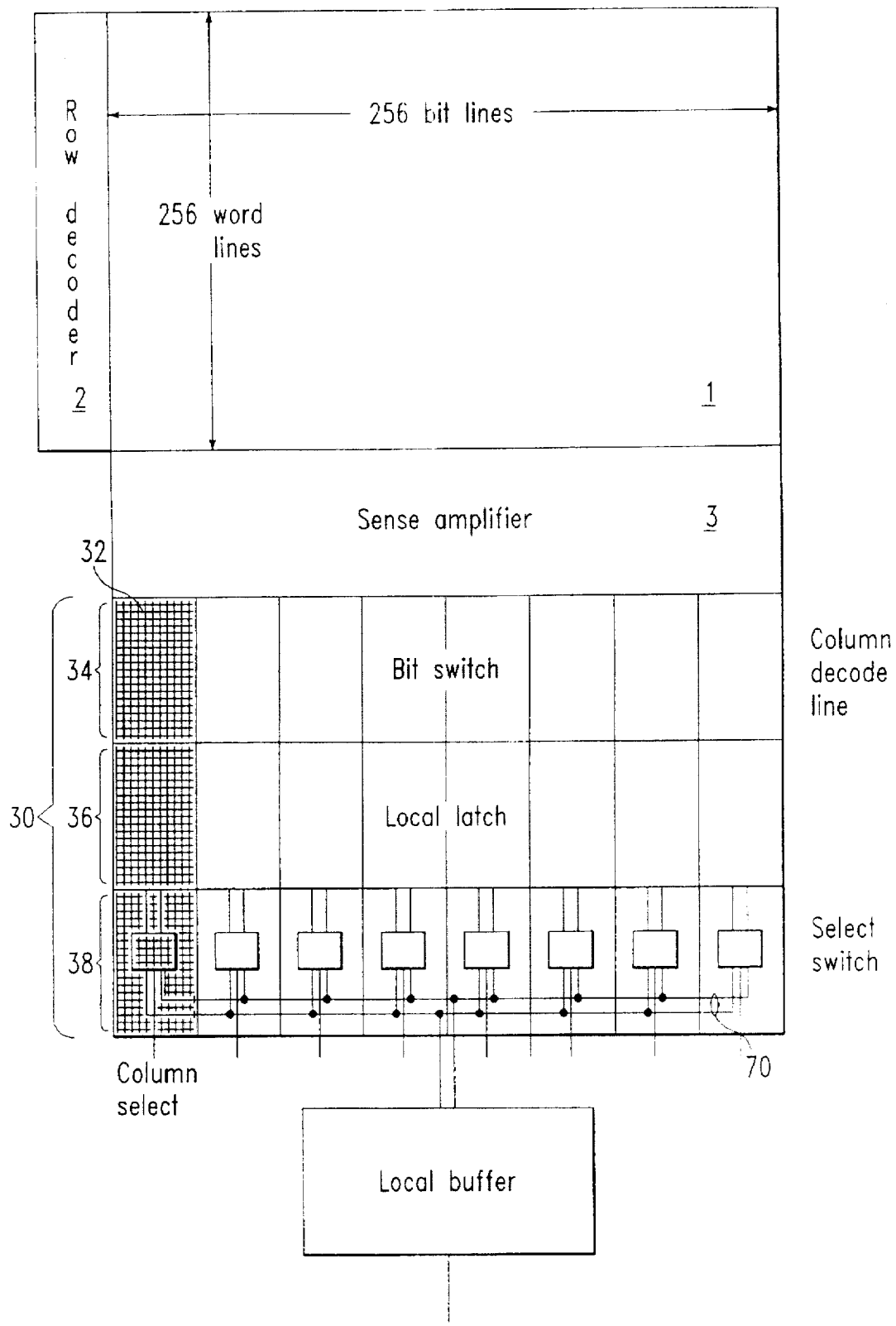
FIG. 3 is a schematic view of a DRAM array according to the present invention.

FIG. 3 is a block diagram of DRAM cell array according to the present invention. Here, similar components to those of FIG. 1 are identified by the same references. The memory array is composed of, for example, a 256×256 cell matrix 1 in which a row address decoder 2 is connected to word lines, and a column address decoder (not shown) is connected to bit lines through a sense amplifier 3 and circuits 30. 256 bit lines are divided into groups of 32 lines to form one block 32 (shaded area) so that there are eight blocks in total. According to a preferred embodiment, 32 bit lines contained in one block 32 can be addressed by the last five digits of a column address. Each circuit group 30 comprises a bit switch 34, a local latch 36 and a select switch 38 all of which are connected in series. One bit switch 34 is connected to each of 32 bit lines (not shown). The bit switch 34 has the same function as the prior art in that it connects the sense amplifier 3 to the data line by conducting or shutting off the bit line. One local latch 36 is preferably provided for each block 32. The local latch 36 stores one output data from each block 32. Thus, data appearing on the bit line is not connected to the data line as is, but is once stored in the local latches 36 one of which is provided for each block. Then, it is selected by the select switch 38 for selecting the local latch 36, and appears on a read bus 70. Accordingly, since the load connected to the data line is only eight MOSFETs, the load capacitance can be significantly reduced than the prior art (256 MOSFETs being connected on the data line). It is one object of the present invention to reduce the load capacitance on the data line. It is already described that this provides a possibility to significantly shorten the RAS access time.

Figure 4:
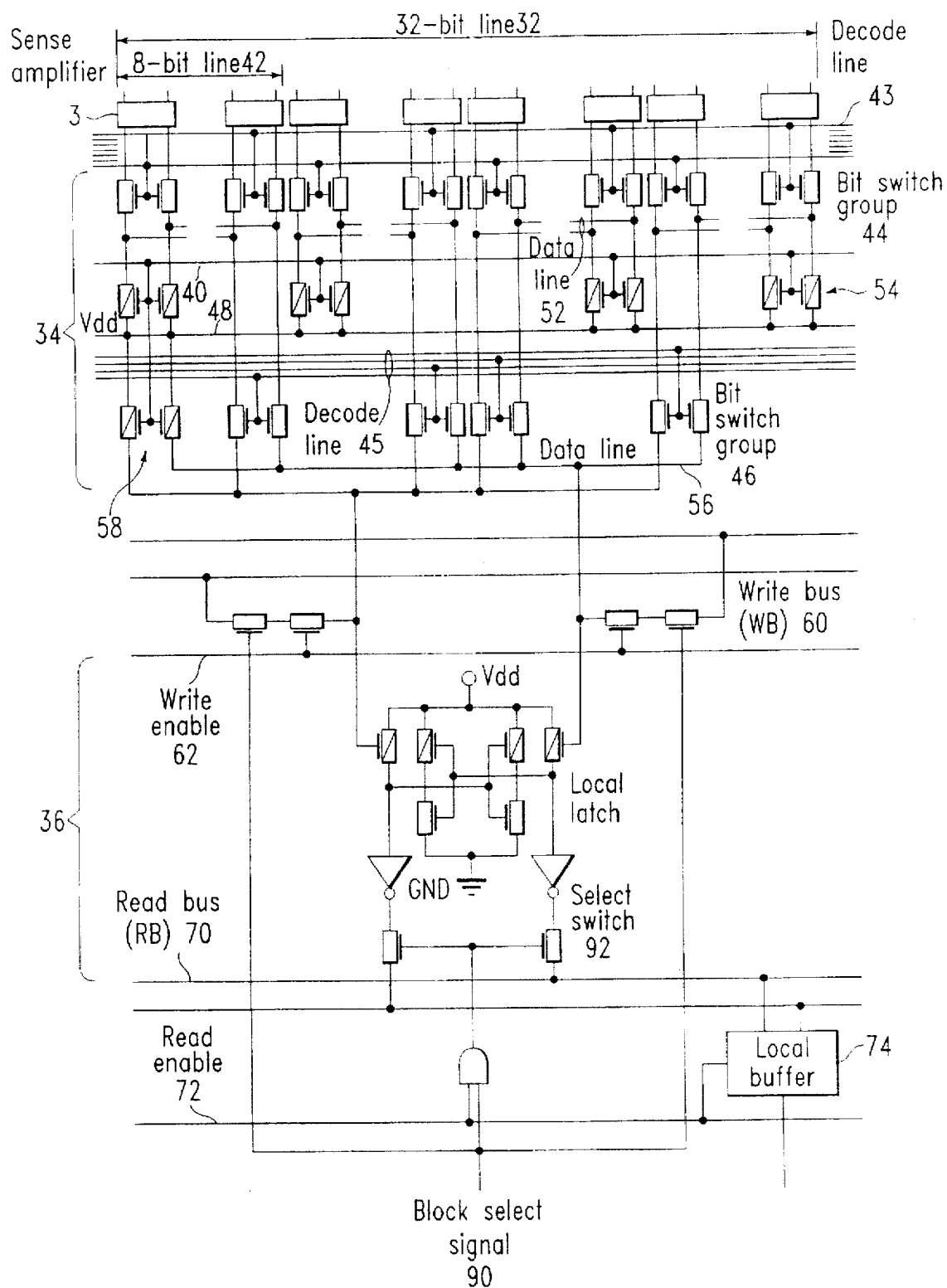
FIG. 4 is a detailed diagram of the DRAM array according to the present invention.

FIG. 4 shows in more detail a region around a circuit group 30 for one block 32 which is an essential component of the present invention. It should be noted here that components which cannot be shown in FIG. 3 are shown in FIG. 4. The bit switch 34 is connected to the sense amplifier 3 at the memory cell side, and to the local latch 36 at the other side. The sense amplifier 3 is sequentially connected to a first decode line 43, a first bit switch group 44 corresponding thereto, a first data lines 52 corresponding to each bit line, a precharge select line 40 for controlling whether or not precharge voltage should be supplied, a precharge select switch 54, a precharge line 48 for supplying the precharge voltage, a second decode line 45, a second bit line group 46 corresponding thereto, and a second data line 56, and to the write bus 60. The sense amplifier 3 is connected to each bit line. Therefore, 32 sense amplifiers are connected in parallel in one block 32. In the preferred embodiment, one block is subdivided to four sub-block 42. Accordingly, in the embodiment, one sub-block 42 is constituted as a bundle of eight bit lines.

The bit switches are serially arranged in two stages. Since the first bit switch group 44 is provided for each bit line, in one sub-block 42, there are eight bit switches contained in the first bit switch group. Eight bit switches contained in one sub-block 42 are determined for whether they should be selected by the first decode line 43. The embodiment uses the last three bits of the column address CA (bit 5, 6, and 7) as decode address supplied to the first decode line 43. The bit switch is actually constituted by MOSFETs, and one bit switch is connected to each of eight decode lines, whereby one bit switch corresponding to bit 5, 6 or 7 can be always selected. The second bit switch group 46 and the second decode line 45 have the same relationship as the first bit switch group 44 and the first decode line 43. However, since there exist only four bit switch groups 46 in one block 32, they are addressed by tow intermediate bits (bit 3 and 4) of the column address bits. Four second bit switch groups are assigned to respective sub-blocks 42. Therefore, one bit line is selected by the lower five bits bits 3–7) of the column address bits through the first and second (bit switch groups. As the result of selection, data on the write bus 60 is placed on a desired bit line through the first and second data lines 52 and 56, and written into a desired cell. In case of read, the data taken out from the cell is stored in the local latch 36 as described later.

To read or write the data, it is necessary to precharge the data and bit lines. It is one feature of the present invention to precharge the data and bit lines to Vdd, the maximum potential, instead of at an intermediate potential between Vgnd and Vdd. The precharge voltage Vdd is stored in a precharge line 48. The potential Vdd on the precharge line 48 is supplied to the first data line 52 through the precharge select switch 54. The precharge select switch 54 is driven by the precharge select line 40. Since the precharge is also required for the second data line 56, the precharge select line 40 simultaneously supplies to another precharge select switch 58 which serves as a switch providing the precharge voltage Vdd for the second data line 56. While precharging of the bit line is not specifically shown in the figure, it may be attained by a conventional circuit connection.

The present invention selects a particular column address by serially constituting the bit switches in two stages with the above principle. In writing, the data is on the write bus 60, and the data is written in the cell by turning on a write enable 62 after selecting the column address.

Then, in reading, the data is once stored in the local latch 36. One local latch 36 is provided for each of the blocks 32. The data stored in the local latch 36 is output through a read bus 70. A read enable 72 is linked to the write enable 62 to select either state of write or read. In addition, the read enable 72 is arranged to be activated by the upper three bits (bit 0, 1, 2) of the column address, thereby enabling it to perform selection between the blocks.

Meanwhile, the data may be output by providing an additional local buffer 74 on the read bus 70, and once storing the data in the buffer. Serialization of data is performed in the local buffer 74 for burst transfer.

One of the objects of the present invention is to reduce load capacitance of the data line. When the present invention is overviewed from such point of view, as shown in FIG. 4, the data line is connected to the local latch 36 through the data line which contains two-stage gates. In the first stage, one of eight bit switches is specified by using the lower bits 5, 6, and 7 of the column address, while, in the second stage, one of four bit switches is specified by the intermediate bits 3 and 4 of the column address. With this approach, load on the data line to which an ultimately selected bit line is connected is 8 nodes+4 nodes=12 nodes. This can further reduce the load than not only 256 nodes as in the prior art, but also than a case where an approach in which one of 32 nodes are directly selected without multistaging the selection by the column address is employed. This approach provides about 0.09 pF as the load on the data line, which has been considered to be about 1.8 pF in the prior art. This is a value further lower than the load of the bit line itself. Such extreme reduction of the load capacitance on the data line suppresses the variation of voltage on the bit line at the moment when the bit line turned on at minimum, and enables it to start the sensing at an early moment. This is because the present invention divides the bit switches into a plurality of groups and arranges them in a hierarchy.

One of features of the present invention is to precharge the data line to Vdd, the maximum value. An example of the circuit configuration of precharging has been shown in FIG. 4. When the precharge is performed to Vdd, the initial signal development on the bit line when the bit switch is turned on becomes faster and larger than when the precharge is performed to the intermediate potential. This is because higher overdrive |Vgs–Vt| is applied to PMOS where Vgs is the voltage between the gate and the source, while Vt is a threshold voltage. That is, because the gate voltage is driven in a direction of reduction from Vdd, Vgs becomes larger as the source voltage is closer to Vdd so that higher overdrive is caused. Since the source voltage is at the bit line voltage when reading the cell, when the precharge on the bit line is closer to Vdd, the overdrive becomes larger, whereby larger current can be caused to flow and the speed is increased. When the precharge select line 40 is turned on by applying Vdd to the precharge line 48, the individual precharge select switches 54 and 58 are turned on so that the first and second data lines 52 and 56 are precharged to Vdd. When the sense amplifier 3 is turned on in this state, only the bit lines relating to MOSFETs selected by the first and second decode lines 43 and 45 are connected to the data lines charged to Vdd.

Figure 2:
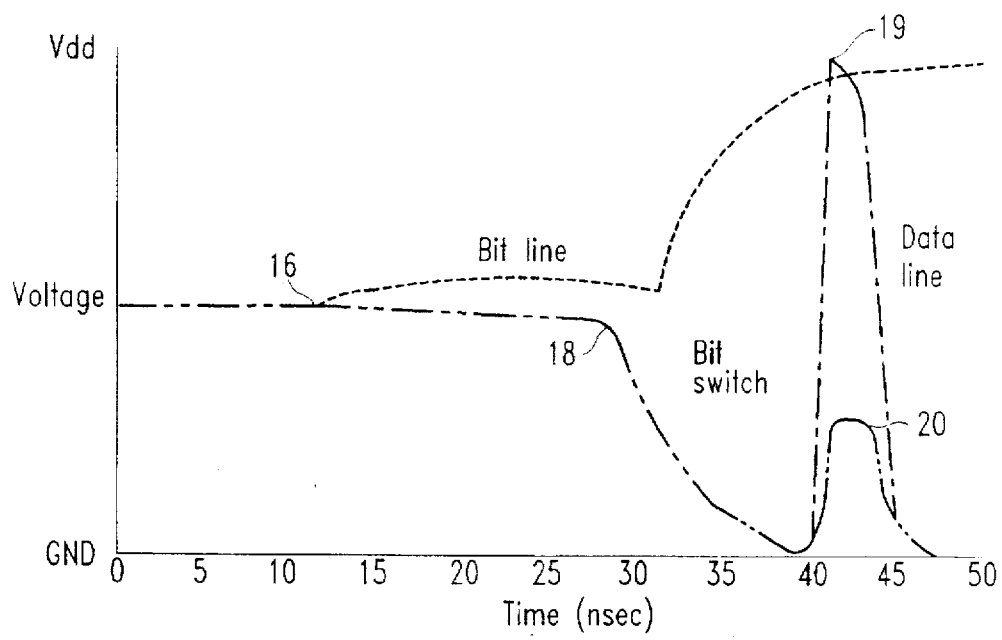
FIG. 2 is a potential transition graph for a bit line or the line in the DRAM array according to the prior art.
Figure 5:
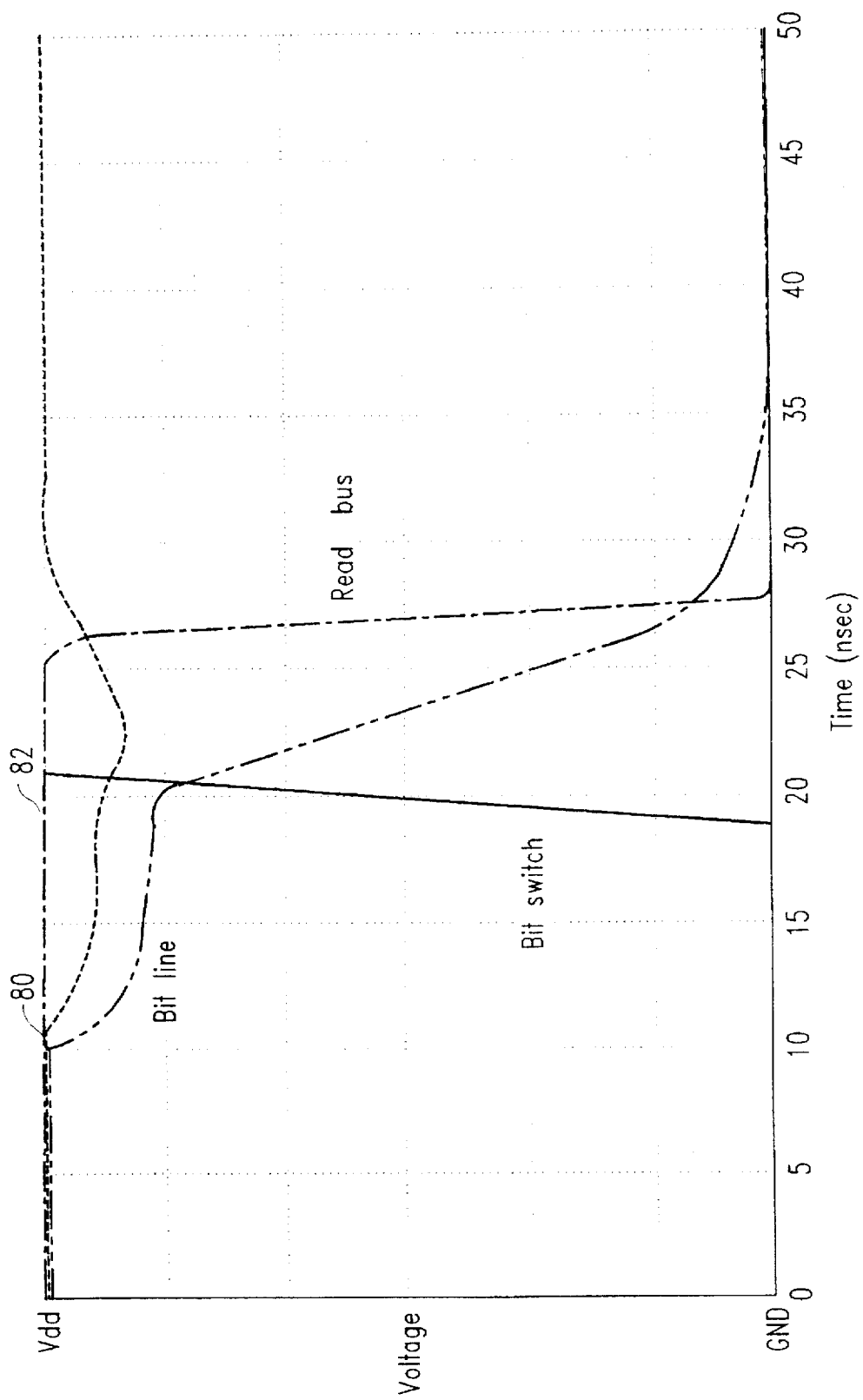
FIG. 5 is a potential transition graph for a bit line or the like in the DRAM array according to the present invention.

FIG. 5 shows behavior of potential appearing on the bit line, the bit switches and the read bus when this operation is performed with respect to time. In an interval from 0 to 10 ns, the bit line is charged to Vdd. Thereafter, from the moment 80 or later, variation of potential appears on the bit line depending on the data. While the potential appearing on the bit line differs for 0 state and 1 state, the sense amplifier 3 cannot be turned on unless, in general, such difference becomes about 150 mV. The reason why the sense amplifier 3 is not turned on until the moment 18 in FIG. 2 showing the prior art lies in this fact. The potential difference of 150 mV necessary to turn the sense amplifier 3 on also is true in FIG. 5. However, while the prior art precharged to the intermediate potential requires about 15 ns, about 10 ns are sufficient for the present invention precharged to Vdd. Thus, the sense amplifier 3 can be turned on earlier by that amount.

When the bit switch is turned on by applying the potential to the decode line in correspondence to the address, the data line is connected to bit line. However, as seen in FIG. 2, in the prior art, since the inversion 20 is caused by the large load on the data line at that moment, it is necessary to connect the data line and the bit line after the amplification of potential is sufficiently performed by the sense amplifier. Thus, since the bit switch cannot be turned on until the moment 19 in the prior art, as much as 30 ns is required from the initial voltage difference on the bit lines to connection of the data lines. On the other hand, according to the present invention, because the load capacitance on the bit line is significantly reduced, no inversion of potential is not caused even if the bit switch is turned on to connect the data line to the bit line. This means, as shown in FIG. 5, that the bit switch can be turned on at substantially same timing as the moment 82 when the sense amplifier is turned on. When the bit switch is turned on, voltage difference on bit-line pair due to stored data can be observed on the data-line pair. While the prior art takes 35 ns from starting of signal development on the bit line to fluctuation of potential on the data line, it appears as read signal on the read bus in about one half or 17 ns.

Thus, the approach of the present invention enables it to read data from DRAM at a very high speed.

Now, the operation of DRAM system according to the arrangement of the present invention will be described. Referring to FIG. 4, in reading, the write enable 62 is held at the low level, and the write bus 60 is disconnected from the data line 56. In this case, since the read enable 72 is held at the high level, and all the block select signals 90 are initially held at the low level, the switch 92 for selecting the local latch 36 is turned off. The first data line 52, the second data line 56, and the bit line are precharged to Vdd by the precharge line 40 prior to sensing (although not shown, the bit line being precharged with a sense amplifier or the like by the conventional method). Since this precharge is performed prior to sensing, however, NMOSs constituting the bit switch groups 44 and 46 do not conduct even if their gates are held at Vdd. The non-conductive state continues as long as the potential on the bit line is at Vdd−Vth (Vth being the threshold potential for the bit switch composed of NMOSs) or higher. This is important in attaining the object of the present invention to increase the RAS access because, even if data to be read appears on the bit line, the bit line is not connected to the data line unless the potential of the sense amplifier shifts below Vdd−Vth after its operation).

Since the first and second data lines 52 and 56 have the load capacitance of 0.09 pF, respectively, which is smaller than the load capacitance of 0.3 pF on the bit line, these data lines can operate without affected by the load capacitance. Then, the gate voltage of PMOS connected to the local latch 36 becomes the low level, and the data appearing on the bit line is stored in the local latch 36. The operation up to the storage in the local latch 36 is simultaneously performed in parallel for all of eight local latches 36 contained in one block 32. Thereafter, the data stored in eight local latches 36 are transferred to the local buffer 74 in a predetermined order after the block select signal 90 is specified. The order for storage is determined by the CPU or the like which supplies the block select signal 90. The data stored in the local buffer 74 in the predetermined order is externally output through burst transfer.

With these operations, the present invention enables it to (1) shorten the RAS access time, and to (2) output continuous data at a high speed through burst transfer. That is, the two approaches for increasing the speed which have not been incompatible in the prior art can be successfully combined.

In the actual read operation, since the gate potential of PMOSs for the local latch 36 is held at Vdd until the sense amplifier 3 starts its operation thereby turning the bit line to Vdd−Vth, the bit switch is not necessary to be turned on before a signal to be read appears on the bit line. However, the bit switch is turned on immediately after the sense amplifier 3 is activated (preferably, within 5 ns) under apprehension on slight leakage current near Vth. Thus, it is an advantage of the present invention that, in principle, it is not necessary to be so CONCERNED ABOUT the timing for turning on the bit switch as in the prior art. (In the DRAM array according to the prior art, the bit switch cannot be turned on unless the sense amplifier is fully activated and the potential is driven to an extent where the inversion by the load capacitance on the data line does not affect.)

The RAS access time is shortened by two causes on the basis of precharging to Vdd potential and reduction of load capacitance on the data line. That is, precharging to Vdd causes the potential on the bit line to be sharply changed by the signal to be read, and such change of potential enables it to be transferred to the local latch immediately after the sense amplifier is driven.

The embodiment is described for a DRAM cell using PMOSs. However, it will be easily practiced by those skilled in the art that the idea of the present invention is adopted in a DRAM cell using NMOSs. It will be sufficient to constitute the bit switch by, for example, PMOSs, and precharge potential relating to the bit line and the data line is determined to be Vgnd.

The DRAM system according to the present invention is also excellent over those according to the prior art in view of the area on the semiconductor wafer to be consumed. The column decoder of the DRAM according to the prior art is to select one out of 256 cells. Therefore, NAND trees and bit switch drivers necessary for it consume much area. On the other hand, since the present invention performs decoding in two stages, it takes a form to select one out of 32 even at the maximum. The components unique to the present invention include the local latches, drivers for the local latches, and wiring for selecting blocks of the local buffers. There are only eight local latches for each block, and only one local buffer for each block. In addition, these additional components are not restricted by the pitch of column. Thus, these additional components never seriously affects the consumed area on the wafer. As the result, the DRAM array according to the present invention can be implemented with a consumed area of 80–90% of that for the DRAM array according to the prior art. This is very advantageous in the cost.

As may now be appreciated, 256 bit lines are divided into eight blocks of 32 lines for each of which a local latch is provided. Data stored in eight local latches contained in one block is then transferred to the local buffer in a predetermined order compatible with the order of burst transfer. Thus, data can be continuously output at a very high speed by the burst transfer.

In addition, the bit lines are connected to the data lines by hierarchical bit switches. Accordingly, the number of the bit switches (MOSFETs) connected to one data line is significantly reduced from the number of bit switches in the prior art. Accordingly, the load capacitance on the data line is very low, and there is no inversion of potential which appears on the data line at the moment the bit switch is turned on. Thus, it becomes possible to turn on the bit switch at an early stage so as to be connected to the data line for obtaining data to be read, and to perform the RAS access at a high speed.

Furthermore, the bit line is precharged to Vdd. Thus, the potential on the bit line is changed sharply by data to be read so that the sense amplifier can be activated at an early timing. This is because, since the data line is also precharged to Vdd, NMOSs constituting the bit switch connects the bit line to the data line only after the sense amplifier starts its operation thereby the potential on the bit line being Vdd−Vth or less. This also contributes to attain the RAS access at a high speed.

Furthermore, the present invention consumes less area of the wafer. Thus, the present invention may be implemented at a lower cost than the DRAM array according to the prior art.

As described, the present invention enables it to (1) shorten the RAS access time, and to (2) output continuous data at a high speed through burst transfer without deteriorating the cost of DRAM array according to the prior art at all. (1) and (2) cannot be simultaneously attained by the prior art. Thus, it becomes possible to provide a DARM array with very high speed, and to provide a main memory with DRAMs which can follow the operating speed of a microprocessor.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention.

What is claimed is:

1. A DRAM array comprising;
   cell matrix of memory cells each connected at an intersection of one of a plurality of word lines and one of a plurality of bit lines;
   a word line detector connected to said plurality of word lines for selecting one of said plurality of word lines to be accessed;
   a plurality of sense amplifiers each of which is connected to one of said plurality of bit lines;
   a bit line decoder connected to said plurality of sense amplifiers for selecting one of said plurality of bit lines to be accessed, said bit line decoder including a plurality of bit switches for connecting one of said plurality of bit lines to be accessed to an external bus, wherein the plurality of bit lines are grouped into at least two bit line segments and the connection between one of said plurality of bit lines to be accessed and said external bus is achieved via more than one of said bit switches connected serially; and
   a plurality of local latches connected to said bit line decoder for storing data bits from a first and a second bit line segment which share a first data line for connecting said bit switch and said local latch, each of the bit line segments are grouped into a plurality of bit line sub-segments said plurality of bit line sub-segments sharing a second data line for connecting said bit switches.

2. A DRAM array as set forth in claim 1, wherein said first data line and said second data line are connected with MOS transistor switches in a number of said bit line sub-segments contained in said bit line segments and in the number of bit lines contained in said bit line sub-groups, respectively.

3. A DRAM array as set forth in claim 2, wherein said MOS transistor switch is composed of NMOSs.

4. A DRAM array as set forth in claim 3, wherein said first data line, said second data line, and said bit lines are connected to a precharger for precharging them to a maximum potential.

5. A DRAM array as set forth in claim 2, wherein said MOS transistor switch is composed of PMOS.

6. A DRAM array as set forth in claim 5, wherein said first data line, said second data line, and said bit lines are connected to a precharger for precharging them to the minimum potential.

7. A DRAM array as set forth in claim 1, wherein said first data line is connected with a first number of bit switches, said second data line being connected with a second number of bit switches, respective bit switches being identified by using parts of bit strings of a supplied column address.

8. A DRAM array as set forth in claim 7, wherein said first number is four, while said second number is eight.

9. A DRAM array as set forth in claim 8, wherein said second number of bit switches are identified by using the lower three bits of said supplied column address, said first number of bit switches being identified by using next two bits following said three bits.

10. A DRAM array as set forth in claim 1, further comprising local buffers, each of said local buffer serially storing data groups relating to said respective bit line segments stored in said local latches in a predetermined order.

11. A DRAM array as set forth in claim 10, wherein said output bus burst outputs data stored in said local buffers.

12. A DRAM array according to claim 1, wherein fluctuation of potential on said bit line is amplified by said sense amplifier while maintaining said first data line, said second data line, and said bit lines either at a maximum or minimum potential.

13. A DRAM array as set forth in claim 12, wherein said bit switch is turned on within 5 ns after said sense amplifier starts its operation.

14. A DRAM array as set forth in claim 12, wherein the time from starting of fluctuation of potential on said bit line to appearance of data on said output bus is 20 ns or less.

* * * * *